(12) United States Patent
Wu et al.

(10) Patent No.: US 8,148,051 B2
(45) Date of Patent: Apr. 3, 2012

(54) METHOD AND SYSTEM FOR MANUFACTURING OPENINGS ON SEMICONDUCTOR DEVICES

(75) Inventors: Tzong-Hsien Wu, Hsinchu (TW); Chao-Lung Lo, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 947 days.

(21) Appl. No.: 12/143,730

(22) Filed: Jun. 20, 2008

(65) Prior Publication Data

US 2009/0314965 A1  Dec. 24, 2009

(51) Int. Cl.
*G03F 7/26* (2006.01)
(52) U.S. Cl. ........................................ 430/311; 430/330
(58) Field of Classification Search ........................ None
See application file for complete search history.

(56) References Cited

U.S. PATENT DOCUMENTS

2003/0157808 A1 * 8/2003 Lin et al. ........................ 438/717

FOREIGN PATENT DOCUMENTS

JP    2005-123312 A  *  5/2005

* cited by examiner

*Primary Examiner* — Kathleen Duda
(74) *Attorney, Agent, or Firm* — Jianq Chyun IP Office (57) ABSTRACT

A method and system to form openings comprises an exposure apparatus and a mask to selectively expose a semiconductor substrate to a radiation source to transfer assist feature patterns and primary feature patterns to a photosensitive layer of the substrate. A heating apparatus eliminates the assist features by heating the substrate and shrinking the primary features. The patterns on the photosensitive layer are transferred to a layer under the photosensitive layer by an etching process.

13 Claims, 7 Drawing Sheets

| Size \ Distance | 130nm | 140nm |
|---|---|---|
| 30nm | Shrink bias 1 | Shrink bias 2 |
| 40nm | Shrink bias 3 | Shrink bias 4 |

METHOD AND SYSTEM FOR MANUFACTURING OPENINGS ON SEMICONDUCTOR DEVICES

TECHNICAL FIELD

The present application generally relates to a method for manufacturing a semiconductor device, and more particularly to a method for manufacturing openings associated with a semiconductor device.

BACKGROUND

There has been a trend in the semiconductor industry toward reducing device size and increasing the packaging density of wafers. Many factors contribute to the fabrication processing in an attempt to maximize efficiency and throughput in the fabrication of semiconductors. Like other aspects of integrated circuit processing, the technology for fabricating contact holes has evolved to keep pace with other advances in the process sequence.

Contacts in a semiconductor integrated circuit allow electrical connection between metal conductors and circuit elements in the semiconductor integrated circuit substrate. With rapid increase of the number of layers in a semiconductor device, contact holes are formed to connect upper and lower wiring layers to each other. As the degree of integration of semiconductor devices increases, the size and space available for forming the contact holes correspondingly decreases. Similarly, the pitch (distance between adjacent contact holes) among semiconductor components also decreases. Thus, critical dimensions (e.g., size, diameter, circumference, etc.) of components, including contact holes, have to be shrunk to fabricate more transistors on one single wafer. A thermal flow process is one methodology to shrink contact holes. This process first uses traditional lithography to form a patterned photoresist layer on a substrate whereafter a thermal flow is additionally performed to shrink the contact holes' dimensions on the patterned photoresist layer. However, the shrinking range of the isolated contact hole is usually greater than the dense contact hole. Consequently, after the thermal flow process, critical dimensions of components in a dense area compared to an isolated area may not be uniform.

BRIEF SUMMARY

According to one embodiment of the invention, an opening is formed by creating at least one assist feature and at least one primary feature on a semiconductor substrate and heating the semiconductor substrate to eliminate the assist feature and shrink the primary feature According to another embodiment of the invention, openings are formed by selectively exposing a semiconductor substrate to a radiation source using a mask, transferring assist feature patterns and primary feature patterns to a photosensitive layer which is provided over the semiconductor substrate and heating the semiconductor substrate to eliminate the assist features and shrink the primary features According to another embodiment of the invention, a mask used to form patterns on a photosensitive layer provided over a substrate comprises at least one assist feature pattern and at least one primary feature pattern, wherein the at least one assist feature pattern and the at least one primary feature pattern are configured to be transferred to the photosensitive layer.

According to another embodiment of the invention, a system comprises an exposure apparatus to expose a semiconductor substrate to a radiation source using a mask for printing out at least one assist feature pattern and at least one primary feature pattern to a photosensitive layer, the photosensitive layer being formed over the semiconductor substrate; a projection apparatus to transfer the patterned assist feature and primary feature into a layer under the photosensitive layer; and a heating apparatus to heat the semiconductor substrate to eliminate the at least one assist feature and shrink the at least one primary feature.

BRIEF DESCRIPTION OF THE DRAWINGS

The foregoing summary, as well as the following detailed description of the invention, will be better understood when read in conjunction with the appended drawings. The embodiments illustrated in the figures of the accompanying drawings herein are by way of example and not by way of limitation. In the drawings.

DETAILED DESCRIPTION

As integrated circuit process geometries scale down to the nanometer territory, the industry faces challenging manufacturing limitations, induced mainly from the current limitations of the lithographic processes. Resolution enhancement techniques (RETs) may be employed to modify masks for integrated circuits to compensate for lithographic limitations, such as optical proximity effect. The most popular techniques are phase-shifting masks, off-axis illumination, and optical proximity correction, etc. With these resolution enhancement techniques, data for a mask pattern are analyzed with a computer program to estimate how a corresponding pattern will print on a mask. The data for the individual mask features may be adjusted such that the pattern created on the wafer will more faithfully match the desired layout. In addition, assist features, such as sub-resolution assist features (SRAFs), may be added to the layout as necessary to improve printing fidelity.

Figure 1:
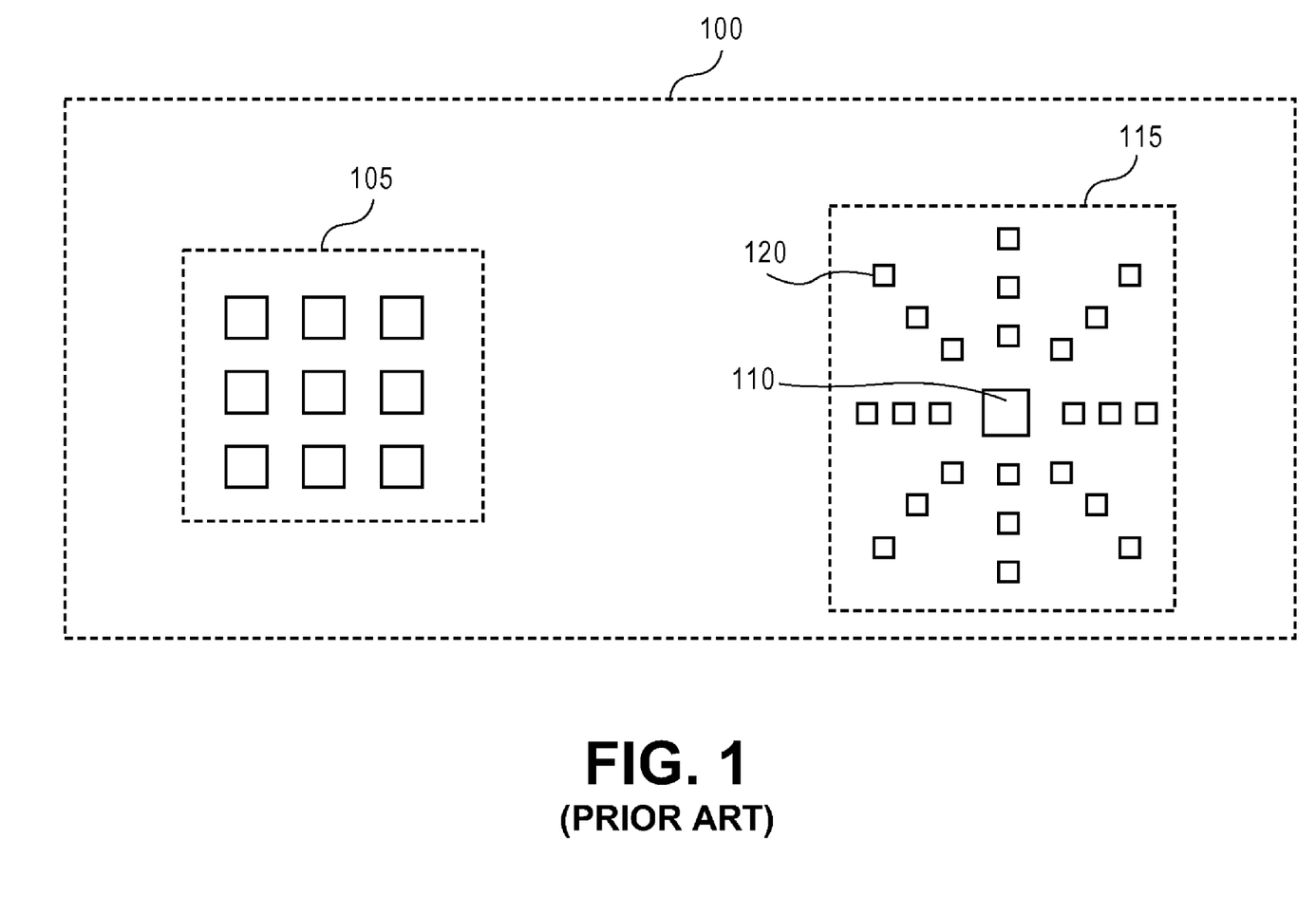
FIG. 1 illustrates a mask with primary features and assist features according to the prior art.

A sub-resolution assist feature (SRAF), also called scattering bars, are designed to improve wafer features in smaller circuits by making the isolated features appear to be dense. For example, placing additional long and thin rectangular shapes or trench on the mask adjacent to a primary feature. FIG. 1 illustrates a mask with primary features and assist features according to the prior art. Referring to FIG. 1, a mask 100 includes primary features in a dense pattern area 105, and a primary feature 110 in an isolate pattern area 115. Since it is difficult to obtain contact holes on the wafer at an equal size in the dense pattern area and the isolate pattern area, sub-resolution assist features 120 are properly placed adjacent to the primary feature 110 on the mask 100, which makes the isolate pattern area 115 seem denser. The problem being solved is generically described as the problem of "iso-dense bias." The challenges of the sub-resolution assist feature include the numbers, sizes, and placement of sub-resolution assist features which are typically predetermined and often follow simple geometric rules. Moreover, the distances from sub-resolution assist features 120 to the primary features 110 and those between sub-resolution assist features are also constrained.

Figure 2:
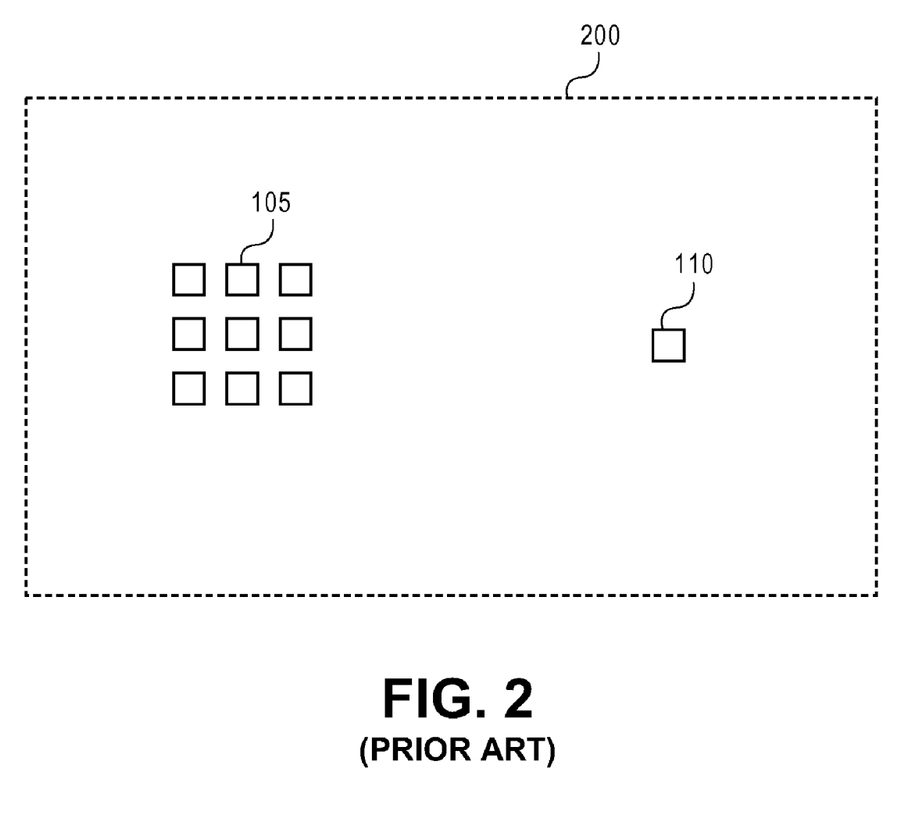
FIG. 2 illustrates contact holes formed on the wafer using the mask illustrated in FIG. 1 and are shrunk after performing thermal flow process according to the prior art.

The sub-resolution assist features 120 should be as large as possible in order to affect the passage of light and thereby impacts an adjacent primary feature 110. As a result, a more dense-like mask pattern may be created to mitigate the optical enhancement effect. However, the sub-resolution assist features 120 should not be too large compared to the wavelength of the light to avoid resolving as primary features. So that the assist features will not be transferred onto the wafer 200, as shown in FIG. 2. Consequently, improper sizes and placements of the assist features may not reflect the shapes of the primary features in the mask precisely, leading to the ends of lines being cut off and sharp corners being rounded. To prevent such a conflict, conventionally, complicated models in compliance with the design rules are developed depending on geometric parameters of features, thereby increasing significant cost in pattern generation, mask and manufacturing cost.

Figure 3A:
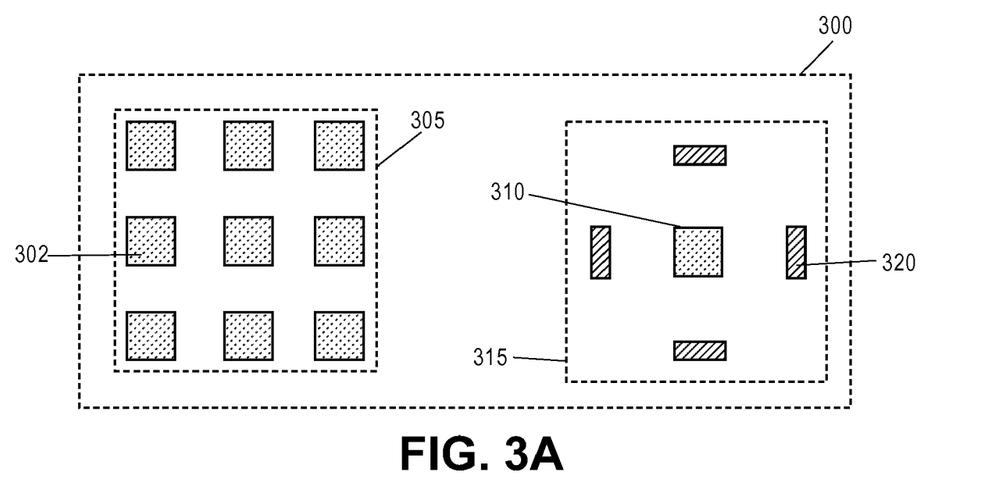
FIG. 3A illustrates a mask with primary features and assist features according to one embodiment of the present invention.
Figure 3B:
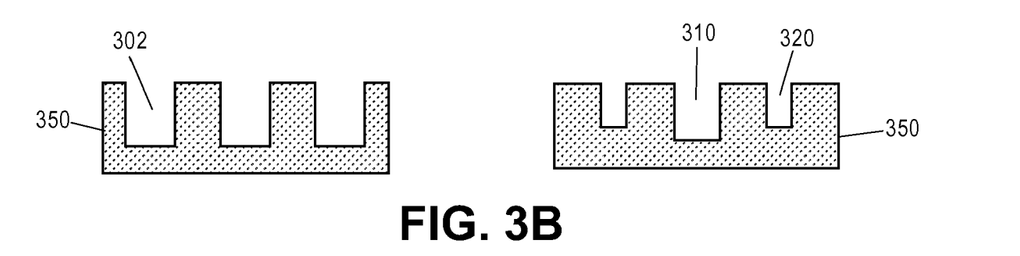
FIG. 3B illustrates a cross-sectional view of forming contact holes on the wafer after performing the lithography process according to one embodiment of the present invention.
Figure 3C:
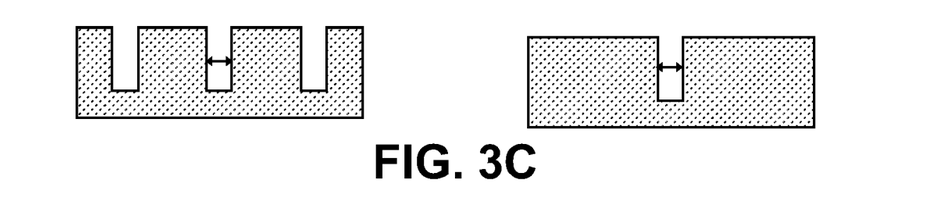
FIG. 3C illustrates a cross-section view of forming contact holes on the wafer after performing the thermal flow process to eliminate unnecessary assist features from the wafer according to one embodiment of the present invention.

FIGS. 3A through 3C illustrate one embodiment of the present invention. FIG. 3A illustrates a mask 300 provided over a photosensitive layer, for example a photoresist layer, which is formed on a semiconductor substrate. The mask 300 comprises geometric patterns corresponding to the circuit components to be integrated onto the wafer. According to the placement of the components, in one embodiment, the mask 300 may comprise primary feature patterns 302 in a dense pattern area 305 and a primary feature pattern 310 in an isolated pattern area 315. The primary feature patterns in both dense pattern area 305 and isolate pattern area 315 may have the same original dimensions. In order to make the isolated area denser to minimize the optical proximity effect, assist feature patterns 320 are placed adjacent to the primary feature pattern 310 in the isolated pattern area 315. In some example embodiments, the shapes of assist feature patterns 320 can be square, rectangular or trench. The patterns used to create such a mask are generated utilizing CAD (Computer Aided Design) programs, this process often referred to as EDA (electronic design automation). Consequently, numbers, sizes and positions of assist feature patterns 320 may be predetermined using empirical or simulation input on process behavior. Most CAD programs follow a set of design rules in order to create functional and manufacturability masks. These rules are set by processing and design limitations. CAD programs may produce mask data as a number of data formats, for example, a commonly used GDSII file or CIF file, that can directly generate mask pattern which complies with design rules.

When the predetermined mask 300 is provided over the photosensitive layer, wafer images of logic circuits may be generated on the semiconductor substrate by a lithography process. In the lithography process, a photosensitive layer 350, such as a photoresist layer, is first formed on a semiconductor substrate as shown in FIG. 3B. Photosensitive layer may comprise photosensitive material that experiences a change in its physical properties when exposed to a radiation source. A desired pattern on the mask 300 may be printed on the photosensitive layer 350 by selectively exposing the photosensitive layer 350 to a radiation source using the mask 300. In some embodiments, the radiation source may be visible, ultraviolet radiation, deep ultraviolet radiation or extreme ultraviolet radiation or any other suitable sources. In one embodiment, both the primary feature patterns 310 and the assist feature patterns 320 are printed on the photosensitive layer 350. After patterning the photosensitive layer 350, the openings and assist features may be formed on the semiconductor substrate by an etching process using the photosensitive layer as an etching mask. Compared to the conventional sub-resolution assist feature (SRAF) method, not only the primary feature patterns 302 and 310, but also the assist feature patterns 320 are printed on the photosensitive layer 350 and etched on the semiconductor substrate.

To achieve higher density and capacity in semiconductor devices, shrinking technologies is combined with the conventional lithography process. For example, one technology proposed is to generate a thermal treatment process in the photosensitive layer by high temperature heat treatment. By carefully designing layout parameters, such as numbers, positions and initial dimensions of assist features, and correctly setting the photosensitive materials thickness and thermal treatment temperature or other conditions, a thermal treatment process, such as a reflow process may be performed. The reflow process of heating the wafer may shrink the dimensions of the contact holes, cover steps and fill holes of the assist features, thereby forming a wafer with uniformed contact holes. FIG. 3C illustrates an embodiment where the contact holes are formed on the photosensitive layer 350 after performing the reflow process.

A semiconductor device comprises contact hole patterns of various sizes and layouts, the effect of thermal flow is strongly dependent on effective parameters, such as the volume of surrounding materials and pattern density. Consequently, layout of assist features and pitches may become two of critical factors in the thermal flow process.

Figure 4:
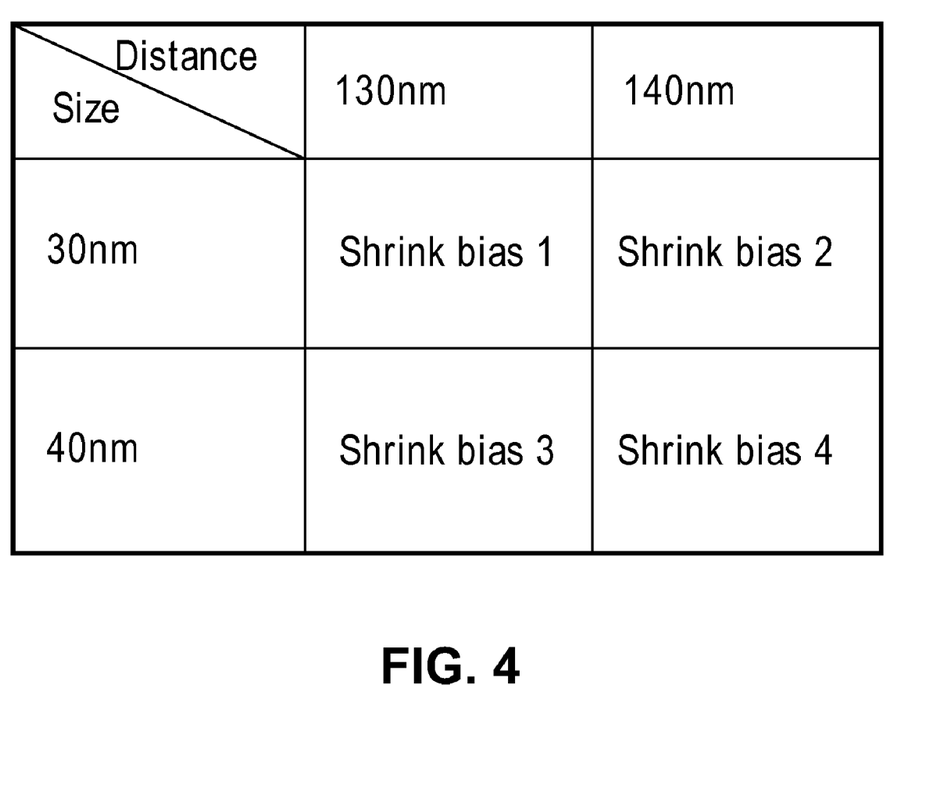
FIG. 4 illustrates a thermal flow rule table.

FIG. 4 shows a rule table to describe the impact on thermal flow effect caused by surrounding materials. As described above, the assist features are added to modify the pattern density. Therefore, the variation of spaces between the assist features and the primary feature as well as sizes of the assist features may result in the change of photosensitive materials volume surrounding the primary feature. As shown in FIG. 4, for example, a 30 nm assist feature placed 130 nm apart from the primary feature may obtain a different shrink bias from an assist feature with a size of 40 nm.

Figure 5:
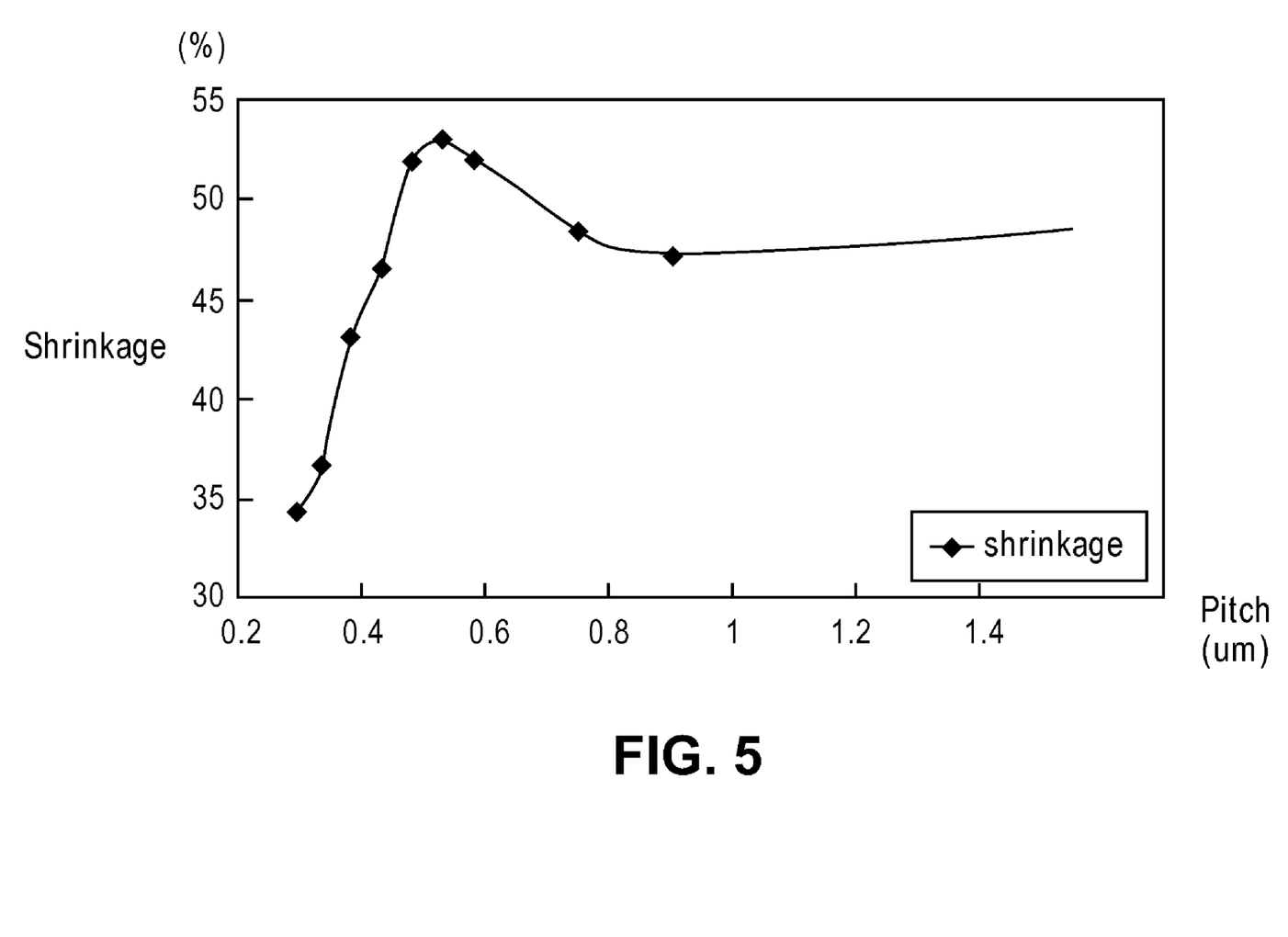
FIG. 5 illustrate a relationship between shrinkage rates and pitch according to one embodiment of the present invention.

FIG. 5 illustrates a relationship between shrinkage rates and pitches. The graph shows the change for a range of pitches from 0.3 um to 1.5 um, at a contact hole size of 190 um. As shown in the graph, in a range of 0.3 um to 1.0 um, the shrinkage rate rises from 0.3 um to 0.5 um and falls after 0.5 um. But from 1.0 um to 1.5 um, the shrinkage rates are almost the same, which is around 47%. This phenomenon may indicate that when the pitch is over 1.0 um, the thermal flow shrinkage effect may not be as significant. Thus, to eliminate assist features along with shrinking the contact holes using the thermal flow process, the relationship between the shrinkage rates and pitches may be one of the critical factors taken into account to determine the sizes and placements of the assist features.

Figure 6:
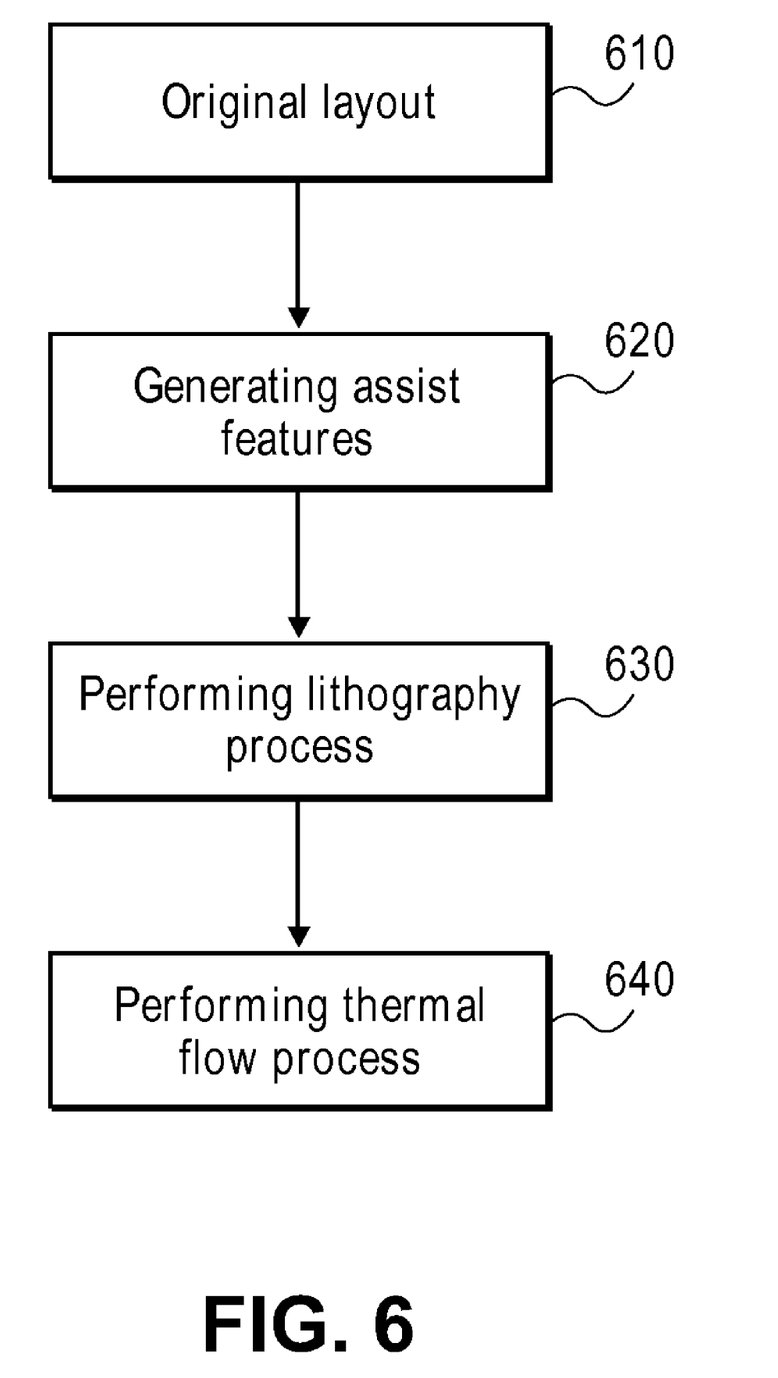
FIG. 6 illustrates a flow chart describing the steps of forming contact holes on the wafer according to one embodiment of the present invention.

FIG. 6 shows a flow chart to illustrate the formation of contact holes according to one embodiment of the invention. At operation 610, layout design and analysis of the entire circuit including the circuit elements is performed. To compensate for manufacturing distortions that are inherent in the manufacturing process, assist features are created by CAD tools at operation 620. The number, dimensions and placement of the assist features on the mask are thus predetermined. Information of circuit layout and assist features layout may be captured in files or databases. Operation 630 includes the lithography process. In the lithography process, a photosensitive layer formed on the substrate is exposed to a radiation source using the mask generated at operation 620 whereafter the mask patters are printed onto the photosensitive layer. An etching or implantation process using the mask may then operate to form contact holes and the assist features on the photosensitive layer. To eliminate the assist features from the photosensitive layer and increase integration of the semiconductor devices, a thermal flow process is applied at operation 640 to generate a thermal flow for shrinking the semiconductor device and fill the assist features. The temperature and other conditions are carefully set so that accurate dimensions of the contact holes of both dense an isolated area may be obtained and the assist features eliminated.

However, in the conventional sub-resolution assist feature method, as found in the prior art, the assist features are not transferred from the mask to the photosensitive layer by adjusting the number, sizes and placements of the assist features. In contrast, in one embodiment of the present invention, the assist features may be printed and etched on the photosensitive layer and eliminated by a thermal treatment process. Among the example technical benefits described above, embodiments of the present invention also reduce the amount of data preparation and cost of the manufacturing process.

Figure 7:
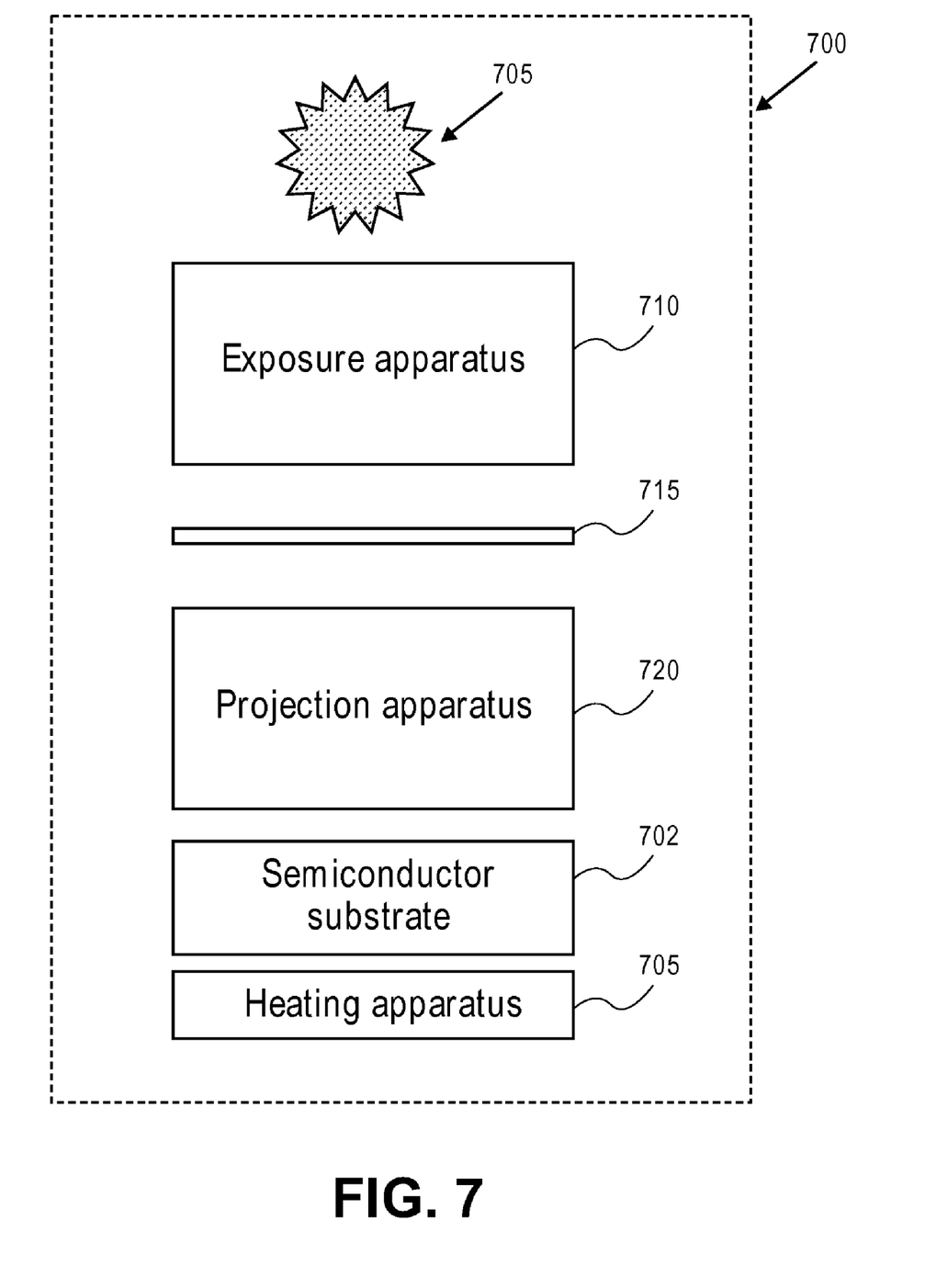
FIG. 7 illustrates a system to perform the method shown in FIGS. 3A to 3B according to one embodiment of the present invention.

FIG. 7 illustrates an example of a system 700 to perform various embodiments of the processes described herein. The components disclosed in FIG. 7 are illustrative of an example embodiment, and it may be appreciated by one skilled in the art there may be many physical component variations to practice the processes disclosed herein and their equivalents.

To obtain openings on a semiconductor substrate 702, the system 700 may comprise an exposure apparatus 710 to expose the semiconductor substrate 702 to a radiation source 705. As described above, the radiation source 705 may be visible, ultraviolet, deep ultraviolet, extreme ultraviolet, or any other suitable sources. Prior to exposure, a photosensitive layer is formed over the semiconductor substrate. Then the substrate is selectively exposed to the radiation source 705 using a mask 715 to print assist feature patterns and primary feature patterns on the photosensitive layer. As described above, the mask 715 may comprise primary feature patterns in a dense pattern area and a primary feature pattern in an isolated pattern area. The shapes of assist feature patterns can be square, rectangular or trench. Numbers, sizes and positions of assist feature patterns may be predetermined by EDA tools. Most CAD programs may create functional and manufacturability masks based on a set of design rules. For simplicity, printed features on the semiconductor substrate 702 are not shown in this system illustration.

In addition, the system 700 includes a projection apparatus 720, which is used to transfer the patterned assist features and primary features into a layer under the photosensitive layer. In one embodiment, the patterns may be transferred using an etching process. The system 700 may also include a heating apparatus 725 configured to heat the semiconductor substrate 702 to shrink the dimensions of the primary features and fill holes of the assist features. The process may operate to keep the primary features uniform and eliminate the assist features.

It will be appreciated by those skilled in the art that changes could be made to the examples described above without departing from the broad inventive concept. It is understood, therefore, that this invention is not limited to the particular examples disclosed, but it is intended to cover modifications within the spirit and scope of the present invention as defined by the appended claims.

What is claimed is:

1. A method, comprising:
   forming openings by creating at least one assist feature and at least one primary feature over a semiconductor substrate; and
   performing a thermal process to the semiconductor substrate to eliminate the assist feature and shrink the primary feature.

2. The method of claim 1 further comprising forming, over the substrate, a photosensitive layer to be patterned with the at least one assist feature and the at least one primary feature.

3. The method of claim 2, wherein creating the assist feature and the primary feature on the semiconductor substrate further comprises selectively exposing the semiconductor substrate to a radiation source using a mask to print at least one assist feature pattern and at least one primary feature pattern to the photosensitive layer.

4. The method of claim 3, wherein creating the assist feature and the primary feature on the semiconductor substrate further comprises transferring the primary feature into a layer under the photosensitive layer by etching.

5. The method of claim 2, wherein the photosensitive layer comprises one of a positive photoresist layer and a negative photoresist layer.

6. The method of claim 1 further comprising predetermining the at least one assist feature pattern and the at least one primary feature pattern on the mask.

7. The method of claim 6 further comprising predetermining the numbers, sizes and placements of the at least one assist feature pattern.

8. The method of claim 6 further comprising generating the at least one assist feature pattern in one shape selected from the group consisting of a square shape, a rectangular shape and a trench shape.

9. The method of claim 1, wherein the source radiation comprises visible light, ultraviolet radiation light, deep ultraviolet light or extreme ultraviolet light.

10. A method, comprising:
    forming openings by selectively exposing a semiconductor substrate using a mask;
    transferring assist feature patterns and primary feature patterns to a photosensitive layer; and
    performing a thermal process to the semiconductor substrate to eliminate the assist features and shrink the primary features.

11. The method of claim 10 further comprising predetermining the at least one assist feature pattern and the at least one primary feature pattern on the mask.

12. The method of claim 10 further comprising predetermining the numbers, sizes and placements of the at least one assist feature pattern.

13. The method of claim 10 further comprising generating the at least one assist feature pattern in one shape selected from the group consisting of a square shape, a rectangular shape and a trench shape.

* * * * *